(12) United States Patent
Cho et al.

(10) Patent No.: US 6,229,747 B1
(45) Date of Patent: May 8, 2001

(54) SELF-REFRESH APPARATUS FOR A SEMICONDUCTOR MEMORY DEVICE

(75) Inventors: Ho Youb Cho, Seoul; Jin Keun Oh, Ichon-shi, both of (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/468,784

(22) Filed: Dec. 21, 1999

(30) Foreign Application Priority Data

Dec. 23, 1998 (KR) .............................. 1998-57508

(51) Int. Cl.[7] ...................................................... G11C 7/00
(52) U.S. Cl. ...................... 365/222; 365/194; 365/230.03
(58) Field of Search .................................. 365/222, 194, 365/230.03, 189.01, 230.01

(56) References Cited

U.S. PATENT DOCUMENTS

| | | | |
|---|---|---|---|
| 4,682,306 | 7/1987 | Sakurai et al. ....................... | 365/222 |
| 5,272,676 | 12/1993 | Kubono et al. ....................... | 365/222 |
| 5,392,251 | 2/1995 | Manning .............................. | 365/222 |
| 5,404,543 | * 4/1995 | Faucher et al. ...................... | 713/323 |
| 5,680,359 | * 10/1997 | Jeong .................................. | 365/222 |
| 5,703,823 | 12/1997 | Douse et al. ......................... | 365/222 |

* cited by examiner

*Primary Examiner*—David Nelms
*Assistant Examiner*—Hoai V. Ho
(74) *Attorney, Agent, or Firm*—Jacobson, Price, Holman & Stern, PLLC

(57) ABSTRACT

A self-refresh apparatus for a semiconductor memory device is disclosed. According to the self-refresh apparatus, Data loss can be prevented by monitoring a leakage of memory cell data, activating a variable self-refresh signal in accordance with a signal resulted from the monitoring during a self-refresh mode, producing a refresh request signal when the self-refresh signal is activated and then refreshing all of memory cells. An unnecessary power consumption can be also prevented by variably performing the refresh operation in accordance with the retention time of cell data.

19 Claims, 10 Drawing Sheets

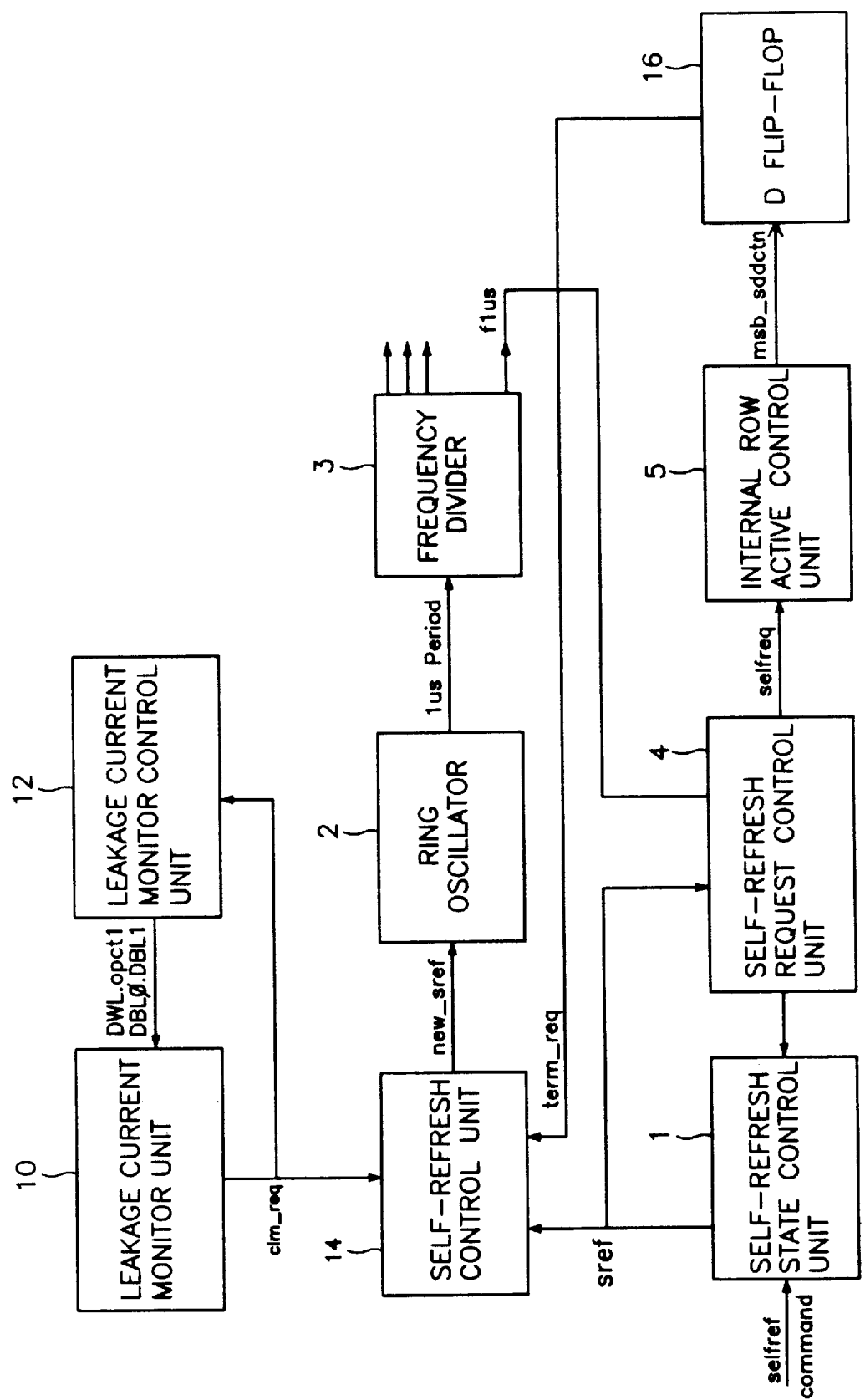

SELF-REFRESH APPARATUS FOR A SEMICONDUCTOR MEMORY DEVICE

BACKGROUND OF THE INVENTION

1. Field of the Invention

The present invention relates to a self-refresh apparatus for a semiconductor memory device and more particularly, to a self-refresh apparatus for self-refreshing a memory cells of a semiconductor memory device such as a dynamic random access memory (DRAM).

2. Description of the Conventional Art

A typical DRAM configuration is a one-transistor memory device configuration in which each one-bit memory cell is composed of a MOS transistor and a capacitor. In this case, the data in memory cells will disappear as time passes because of leakaging currents. Accordingly, the DRAM requires a refresh operation to be carried out at predetermined intervals, to read stored data from the memory and to rewrite the data to the memory.

FIG. 1 shows a block diagram for performing a conventional self-refresh operation. As shown in FIG. 1, when a self-refresh command (selfref command) is inputted to a self-refresh state control unit (1), the self-refresh state control unit (1) outputs a self-refresh state signal (sref) to a ring oscillator (2).

The ring oscillator (2) is operated by the self-refresh state signal (sref) and produces a pulse signal (1 μs Period) having 1 μs period. The pulse signal (1 μs Period) is inputted to a frequency divider (3) and is converted into a pulse signal having 16 μs period.

Then, a self-refresh request control unit (4) receives a pulse signal (f16 μs) having a 16 μs period outputted from the frequency divider (3) and the self-refresh state signal (sref) produced by the self-refresh state control unit (1), and then produces a self-refresh request signal (selfreq) every 16 μs.

The self-refresh request signal (selfreq) is inputted to an internal row active control unit (5), refreshes cells corresponding to an internal address and increases the number of address by means of an internal address counter.

FIGS. 2a and 2b show timing charts for explaining the self-refresh operation of FIG. 1. FIG. 2a shows a situation where the cell data are destroyed owing to the decrease of the retention time of cell data in accordance with variations in temperature, voltage, manufacturing process and the like. As shown in FIG. 2a, a refresh time of following cells becomes longer than the retention time of data, thereby causing data in the cells to be destroyed.

FIG. 2b shows a situation where the retention time of cell data is increased. In the conventional self-refresh mode as shown in FIG. 1, there are cells unnecessarily refreshed, thereby causing the unnecessary power consumption.

SUMMARY OF THE INVENTION

The present invention has been made in order to solve the problems encountered in the conventional art as mentioned above, and an object of the present invention is to provide a self-refresh apparatus for a semiconductor memory device capable of preventing the cell data from being destroyed owing to a leakage of the cell data caused by variations in temperature, voltage, manufacturing process and the like.

Another object of the present invention is to reduce an unnecessary refresh currents by performing a self-refreshing operation based on the actual data retention time of cell.

In order to achieve the above objects, the self-refresh apparatus for a semiconductor memory device according to an embodiment of the present invention comprises:

a monitor means for monitoring a leakage of memory cell data;

a self-refresh control means for producing a variable self-refresh signal in accordance with the output signal from the monitor means during a self-refresh mode; and a refresh means for refreshing all of memory cells by producing a refresh request signal while the variable self-refresh signal is activated.

According to other embodiment of the present invention, the self-refresh apparatus for a semiconductor memory device comprises:

a monitor means for monitoring a leakage of memory cell data and outputting a refresh active signal;

a self-refresh control means for activating a self-refresh signal in response to the receipt of the refresh activating signal after entering into a self-refresh mode;

means for outputting a self-refresh request signal having a predetermined period while activating the self-refresh signal;

means for refreshing all of memory cells based on the self-refresh request signal; and means for detecting the termination of refreshing over all of memory cells and providing the self-refresh, control means with a signal for deactivating the self-refresh signal.

BRIEF DESCRIPTION OF THE DRAWINGS

These and other objects, features and advantages of the present invention will become apparent in light of the following detailed description in conjunction with the accompanying drawings, wherein:

FIG. 3 is a block diagram showing a self-refresh apparatus for a semiconductor memory device according to the present invention;

FIG. 6b is a timing chart for explaining the operation of the leakage current monitor unit as shown in FIG. 6a;

FIG. 7b is a timing chart for explaining the operation of the self-refresh control unit as shown in FIG. 7a.

DESCRIPTION OF THE PREFERRED EMBODIMENTS

Now, the embodiments of the present invention will be described with reference to the accompanying drawings.

FIG. 3 is a block diagram showing a self-refresh apparatus for a semiconductor memory device according to a preferred embodiment of the present invention.

As shown in FIG. 3, the self-refresh state control unit (1) receives a self-refresh command signal and in response to the signal, transmits a self-refresh state signal (sref) having a predetermined pulse width to the self-refresh control unit (14) and self-refresh request control unit (4).

Figure 5:
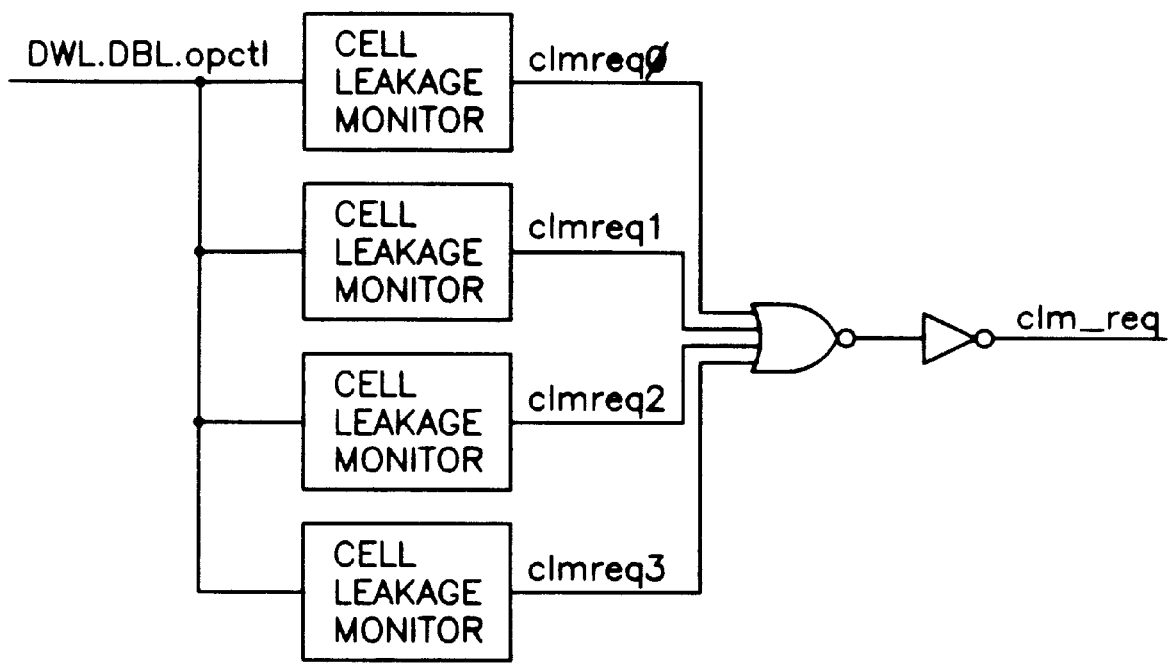
FIG. 5 is a detailed circuit diagram showing a leakage current monitor unit of FIG. 3.

The leakage current monitor unit (10) monitors leakage currents in the memory cell, and sends a refresh active signal (clm_req) according to the monitored result to the self-refresh control unit (14). As shown in FIG. 5, the leakage current monitor unit (10) is comprises total four cell leakage monitor circuits with one cell leakage monitor circuit in each bank, and produces the final refresh active signal (clm_req) by logically operating output signals (clmreq0–clmreq3) from each of the cell leakage monitor circuits by means of OR gate.

Herein, DWL and DBL are a word line and a bit line in cell of the cell leakage monitor circuit, respectively and opct1 is a signal for controlling the integrator of the cell leakage monitor circuit.

If one or more signals among cell refresh signals (clmreq0, clmreq1, clmreq2, clmreq3) in one or more cell leakage monitor circuits become a high state, the refresh active signal (clm_req) in the leakage current monitor unit (10) becomes a high state, and then this signal is inputted to the self refresh control unit (14).

Figure 6A:
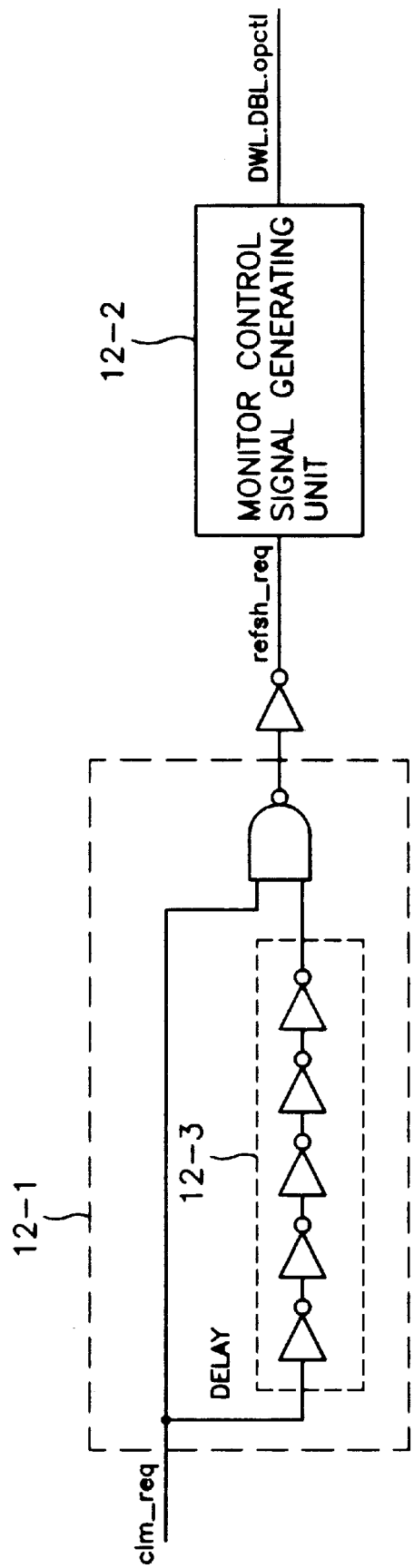
FIG. 6a is a detailed circuit diagram showing a leakage current monitor control unit.

The leakage current monitor control unit (12) is operated by the activated refresh active signal (clm_req), and outputs the leakage monitor control signals (DWL, DBL, opct1) for deactivating the activated refresh active signal (clm_req). As shown in FIG. 6a, the leakage current monitor control unit (12) comprises the pulse generating unit (12-1) and monitor control signal generating unit (12-2).

Figure 6B:
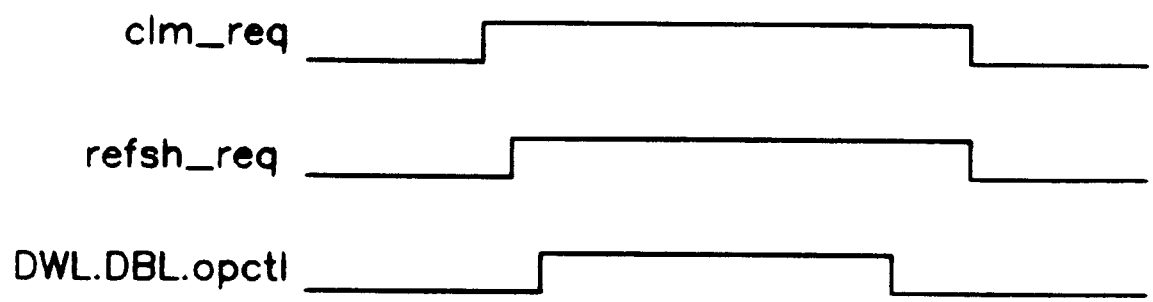

If the high-level refresh active signal (clm_req) (see FIG. 6b) from the leakage current monitor unit (10) is inputted to the pulse generating unit (21-1), the inputted active signal (clm_req) is logically combined with a signal delayed in the delay unit (12-3) by means of the AND gate. As a result, the pulse signal (refsh_req) (see FIG. 6b) is inputted to the leakage monitor control signal control unit (12-2), and activates the leakage monitor control signals (DWL, DBL, opct1), thereby causing the leakage monitor control signal to be a low state.

In FIG. 3, the self refresh control unit (14) activates the ring oscillator (2) by activating a self-refresh signal (new_sref) by means of the self-refresh state signal (sref) activated while operating in the self-refresh mode and the refresh active signal (clm_req), and deactivates the self-refresh signal (new_sref) by receiving a termination signal (term_req) from D flip-flop (16) that will be described hereinafter. Accordingly, the operation of the ring oscillator (2) is disabled until the refresh active signal (clm_req) of the leakage current monitor unit (10) is activated.

The ring oscillator (2) receives the self-refresh signal (new_sref) and outputs a pulse signal (1 $\mu$s Period) having a predetermined period to the frequency divider (3). From receiving the pulse signal from the ring oscillator (2), the frequency divider (3) produces a signal (f1 $\mu$s) having a new pulse period and outputs it to the self-refresh request state control unit (4). The self-refresh request state control unit (4) combines the output of the self-refresh state control unit (1) and the output of the frequency divider (3), and outputs a self-refresh request signal (selfreq) having a predetermined period to the internal row active control unit (5).

The internal row active control unit (5) includes an internal address counter (now shown), and activates the internal low address by means of the self-refresh request signal (selfreq).

The D flip-flop (16) is connected to the uppermost address of the internal row active control unit (5), and outputs a signal (term_req) informing the termination of the self-refresh, when the potential of the uppermost address is changed, to the self-refresh control unit (14).

Figure 1:
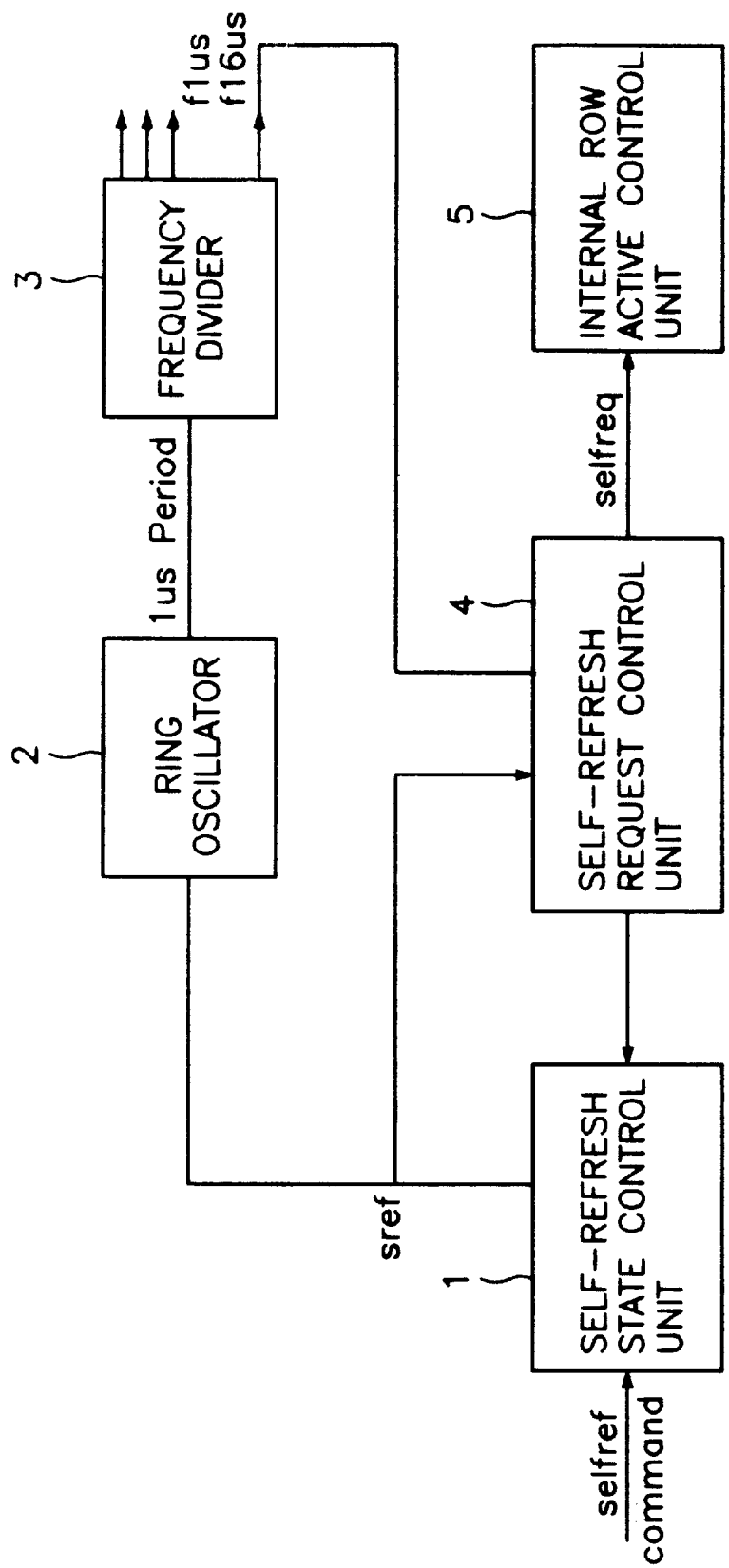
FIG. 1 is a block diagram showing a self-refresh apparatus for a semiconductor memory device according to the conventional art.
Figure 2A:
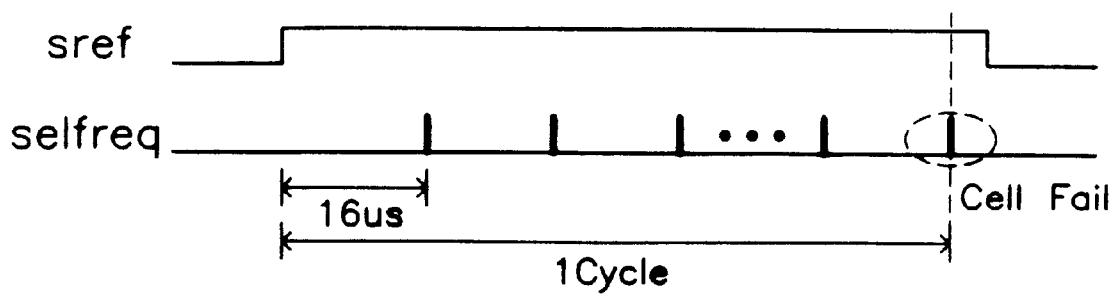
FIG. 2a is a timing chart for explaining the conventional self-refresh operation in the situation where the retention time of data is decreased.
Figure 2B:
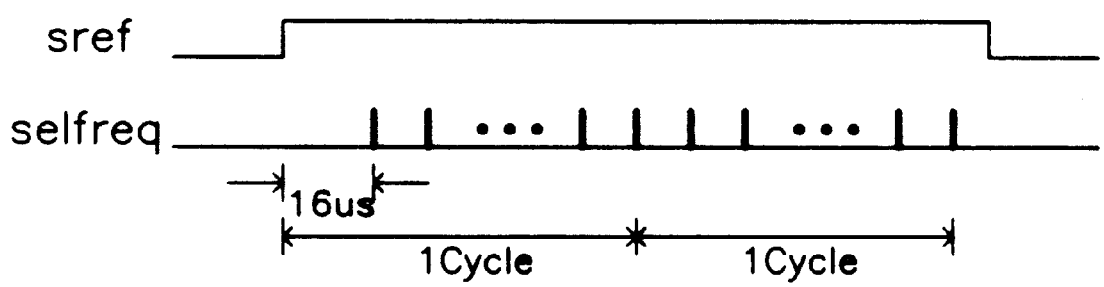
FIG. 2b is a timing chart for explaining the conventional self-refresh operation in case that the retention time of data is increased.
Figure 4A:
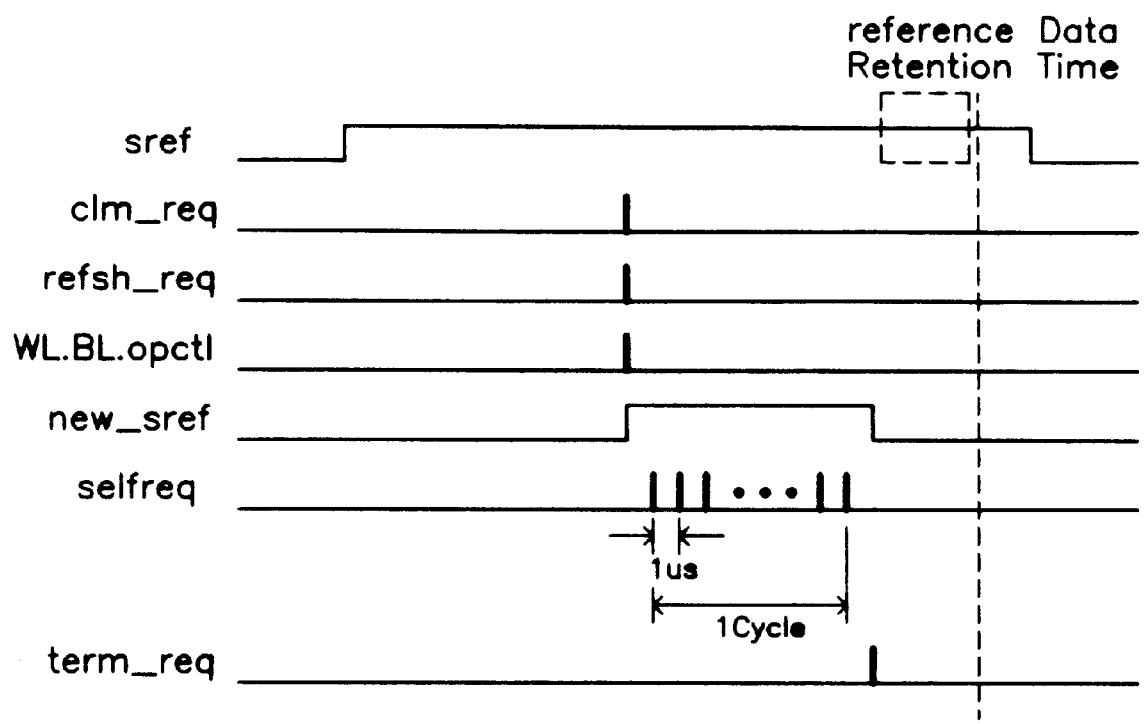
FIG. 4a is a timing chart for explaining the self-refresh operation according to the present invention in case that the retention time of data is decreased.

In the embodiment of the present invention constructed as described above, in case that the retention time of data is decreased, the timing of the self-refresh operation is represented as FIG. 4a. Also, in case that the retention time of data is increased, the timing of the self-refresh operation is represented as FIG. 4b.

As shown in FIG. 4a, in case that the retention time of cell data is decreased owing to variations in an ambient temperature, voltage, manufacturing process or the like (that is, in case that there are much cell leakage), the destruction of the cell data can be prevented by monitoring the cell leakage and producing the refresh active signal (clm_req)

Figure 4B:
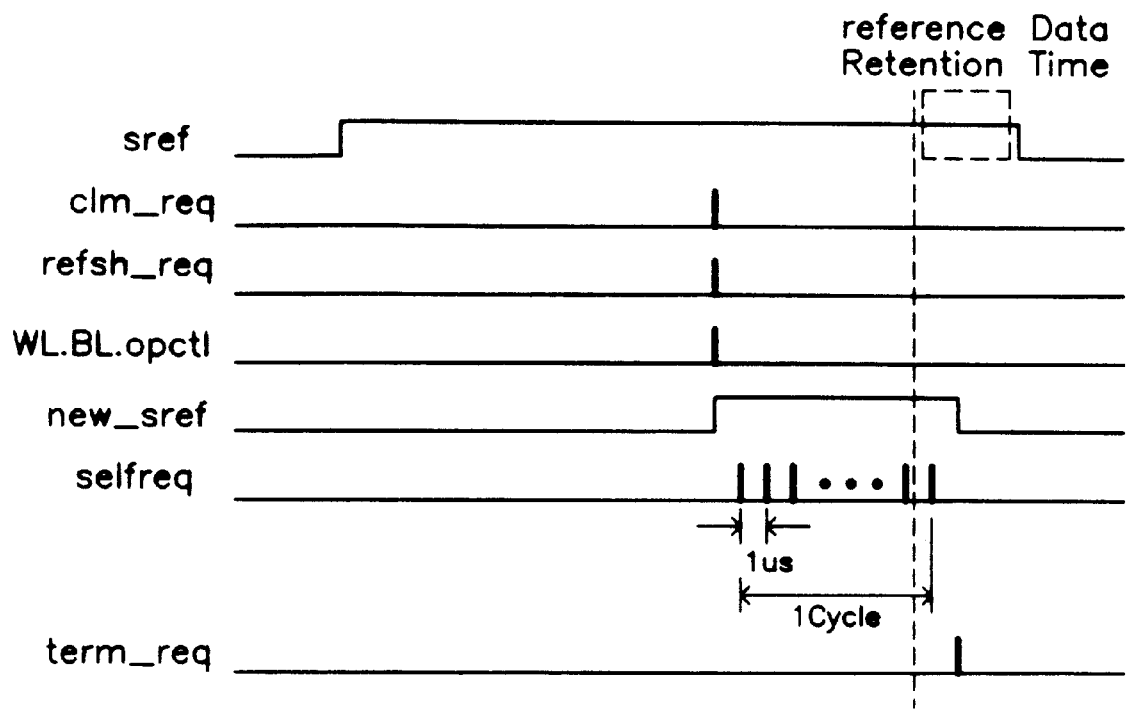
FIG. 4b is a timing chart for explaining the self-refresh operation according to the present invention in case that the retention time of data is increased.

In case the retention time of the cell data is increased (that is, in case that the cell leakage is small), the power consumption in performing the refresh can be reduced because it is possible to extend the refresh active time in the leakage current monitor unit (10) as shown in FIG. 4b.

Also, the power consumption can be reduced because the leakage current monitor unit (10) controls the unnecessary operations of the ring oscillator (2), the frequency divider (3), the internal row active control unit (5) and the like which substantially generate the refreshing operation.

In FIG. 4a, a rectangular shape marked as the dotted line shows the cells of which data become destructive when performing the refresh according to the conventional refresh method. In FIG. 4b, a rectangular shape marked as the dotted line shows the cells that are unnecessarily refreshed when performing the refresh according to the conventional refresh method.

Figure 7A:
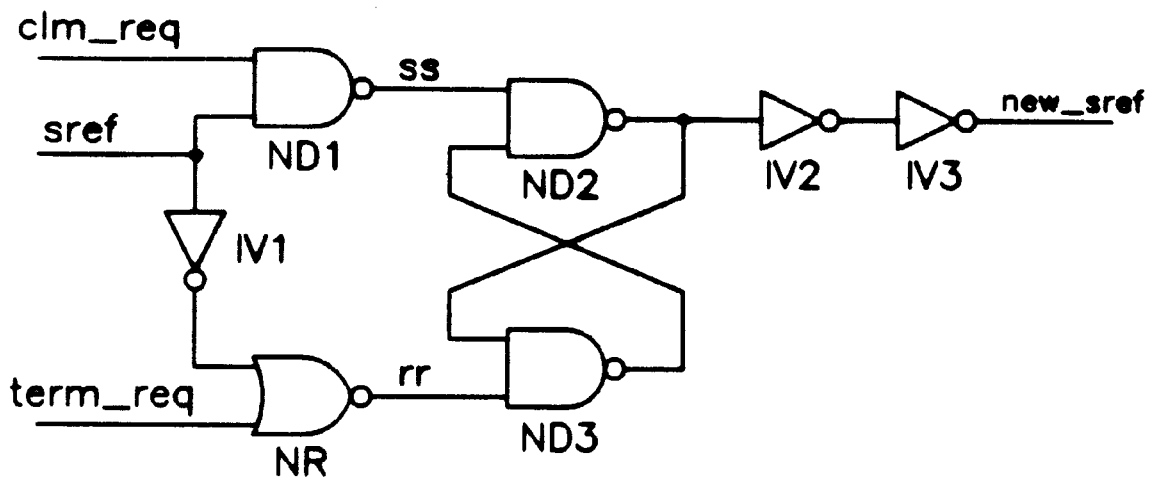
FIG. 7a is a detailed circuit diagram showing a self-refresh control unit.

FIG. 7a is a detailed circuit diagram of the self-refresh control unit (14) according to the present invention. The self-refresh control unit (14) comprises a first NAND gate (ND1) having a refresh active signal (clm_req) and a self-refresh state signal (sref) as input signals; a first inverter (IV1) receiving the self-refresh state signal (sref) and outputting the inverted self-refresh state signal; NOR gate (NR) having the inverted self-refresh state signal from the first inverter (IV1) and a self-refresh terminating signal (term_req) as input signals; a second NAND gate (ND2) having one input terminal connected to the output terminal (ss) of the first NAND gate (ND1), other input terminal connected to the output terminal of a third NAND gate (ND3) and its output terminal connected to the input terminal of the second inverter (IV2); the third NAND gate having one input terminal connected to the output terminal (rr) of the NOR gate (NR), other input terminal connected to the input terminal of the second inverter (IV2) and its output terminal connected to the other input terminal of the second NAND gate (ND2); and second and third inverters (IV2, IV3) connected in serial to the output terminal of the second NAND gate (ND2) and outputting a self-refresh signal (new_sref).

Figure 7B:
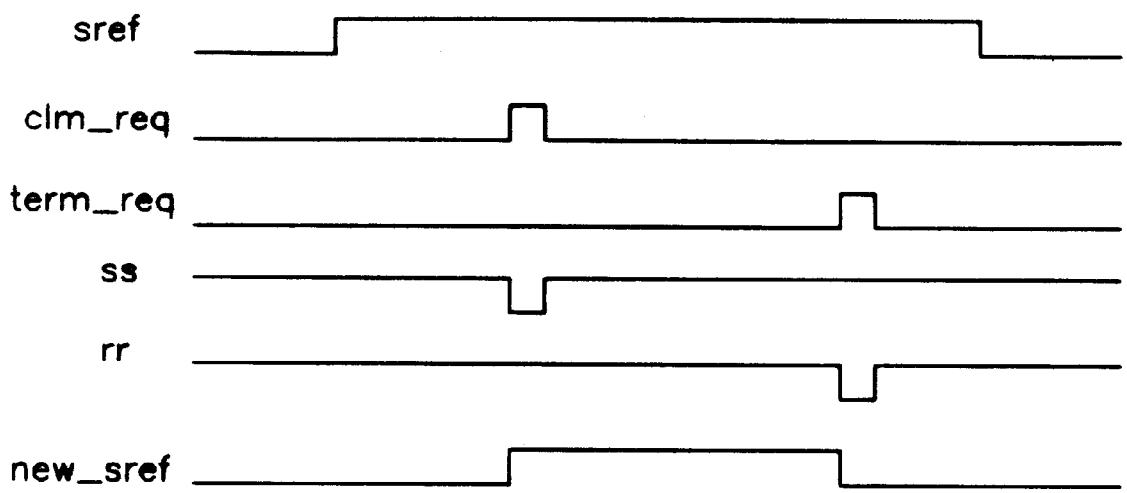

FIG. 7b is a timing chart for explaining the operation of the self-refresh control unit as shown in FIG. 7a.

When the self-refresh state signal (sref) is a high state, if the refresh active signal (clm_req) and the self refresh terminating signal (term_req) maintain a low state, output signals of the first NAND gate (ND1) and the NOR gate (NR) maintain a high state. Accordingly, the two NAND gates (ND2, ND3) with the feedback connection serve as a latch, and the self-refresh signal (new_sref) thus maintains the previous state.

If the refresh active signal (clm_req) becomes a high state, the output signal of the first NAND gate (ND1) becomes a low state, and the self-refresh signal (new_sref) thus becomes a high state.

Thereafter, even though the refresh active signal (clm_req) becomes a low state, the self-refresh signal (new_req) always maintains a high state because it maintains the previous data in the latched condition.

If the self-refresh terminating signal (term_req) becomes a high state, the output signal of the NOR gate (NR) becomes a low state and thusly the self-refresh signal (new_sref) becomes a low state.

Thereafter, even though the self-refresh terminating signal (term_req) becomes a low state, the self-refresh signal (new_req) maintains a low state.

Because D flip-flop (16) is connected to the uppermost address of the internal address counter in the internal row active control unit (5), when the uppermost address changes from a high state to a low state, the D flip-flop (16) is activated and thus outputs a high signal.

That is, this high signal becomes a signal informing that the refreshing operation in all cells has been terminated. Accordingly, if the refresh active signal (clm_req) in the leakage current monitor unit (10) is activated in the state where the self-refresh command was activated, the leakage current monitor control unit (12) generates the leakage monitor control signals (DWL, DBL, opct1).

Meanwhile, the self-refresh signal (new_req) is activated in the self-refresh control unit (14) and at the same time the ring oscillator (2) is operated, all cells are refreshed.

If the refresh operation for all cells is terminated, the self-refresh terminating signal (term_req) is activated, and the self-refresh signal (new_sref) thus becomes inactive. Accordingly, the ring oscillator (2), the frequency divider (3), the internal row active control unit (5) and the like are in a disabled state until the refresh active signal (clm_req) of leakage current monitor unit (10) becomes active.

As described above, the present invention have effects that can prevent a data from getting destroyed, which may be caused by the cell leakage current, by using the self-refresh operation through monitoring as well as an effect to prevent an unnecessary power consumption by flexibly performing the refresh operation in accordance with the retention time of the cell data.

Although the preferred embodiments of the present invention have been disclosed for illustrative purposes, those skilled in the art will understand that various variations, modifications, substitutions and additions may be made without departing from the spirit and scope of the present invention.

What is claimed is:

1. A self-refresh apparatus for a semiconductor memory device comprising:
   a monitor means for monitoring a leakage current of memory cells;
   a self-refresh control means for producing a variable self-refresh signal in accordance with an output signal from the monitor means during a self-refresh mode, said control means including,
      a first logic gate for receiving as input signals a signal indicating entry into said self-refresh mode and said output signal from said monitor means;
      a second logic gate for receiving as inputs an inverted signal of said signal indicating entry into said self-refresh mode and a signal indicating termination of a refreshing operation for said memory cells; and
      a third logic gate for receiving output signals of said first and second logic gates and for outputting a variable self-refresh signal; and
   a refresh means for refreshing all of said memory cells by producing a refreshing request signal while the variable self-refresh signal is activated.

2. The self-refresh apparatus as claimed in claim 1, wherein said monitor means consists of the combination of a plurality of memory cell leakage monitor circuits for monitoring a cell leakage current, and each of said memory cell leakage monitor circuits is installed one each bank and includes a plurality of word lines, a plurality of bit lines, a plurality of memory cells and an integrator.

3. The self-refresh apparatus as claimed in claim 2, wherein said monitor means outputs a signal for activating the refresh operation when an output signal of any one of said memory cell leakage monitor circuits is an active signal.

4. The self-refresh apparatus as claimed in claim 1, wherein said first logic gate is a NAND gate, said second gate is a NOR gate and said third gate is a NAND-type latch.

5. A self-refresh apparatus for a semiconductor memory device comprising:
   a monitor means for monitoring a leakage current of memory cells and outputting a refresh active signal;
   a self-refresh control means for activating a self-refresh signal when said refresh active signal is inputted after entering into a self-refresh mode;
   means for outputting a self-refresh request signal having a predetermined period when said self-refresh signal is activated;
   means for refreshing in a refresh operation all of said memory cells based on said self-refresh request signal; and
   means for detecting termination of said refresh operation for said memory cells and providing said self-refresh control means with a signal for deactivating said self-refresh signal.

6. The self-refresh apparatus as claimed in claim 5, wherein said monitor means consists of the combination of a plurality of memory cell leakage monitor circuit or monitoring the cell leakage current, and each of said cell leakage monitor circuits is installed one each bank and includes a plurality of word lines, a plurality of bit lines, a plurality of memory cells and an integrator.

7. The self-refresh apparatus as claimed in claim 6, wherein said monitor means outputs said refresh active signal for activating the refresh operation when an output signal of any one of said cell leakage monitor circuits is an active signal.

8. The self-refresh apparatus as claimed in claim 6, wherein said refresh control means comprises:
   a first logic gate having a signal for informing an entering into said self-refresh mode and the output signal of said monitor means as its input signals;
   a second logic gate having an inverted signal of said signal for informing an entering into said self-refresh mode and a signal informing that refreshing operation for all of cells have been terminated as its input signals; and a third logic gate having output signals of said first and second logic gates as its input signals and outputting a variable self-refresh signal.

9. The self-refresh apparatus as claimed in claim 8, wherein said first logic gate is a NAND gate, said second gate is a NOR gate, and said third gate is a NAND-type latch.

10. The self-refresh apparatus as claimed in claim 5, wherein said means for providing said self-refresh control means with a signal for deactivating said self-refresh signal is D flip-flop.

11. The self-refresh apparatus as claimed in claim 7, further comprising a leakage current monitor control means for controlling said plurality of word lines, said plurality of bit lines, said plurality of memory cells and said integrator.

12. The self-refresh apparatus as claimed in claim 11, wherein said leakage current monitor control means includes:

a pulse generator for generating a pulse having the same phase when said activated refresh active signal is inputted; and a circuit unit for activating said plurality of word lines, said plurality of bit lines, said plurality of memory cells and said integrator by means of said pulse from the pulse generator.

13. The self-refresh apparatus as claimed in claim 12, wherein said pulse generator includes:

a delay for delaying said refresh active signal; and a logic gate having an output signal of said delay and said refresh active signal as its input signals.

14. A self-refresh apparatus for a semiconductor memory device having memory cells comprising:

a self-refresh state control means for receiving a self-refresh command signal, and for outputting a self-refresh state signal having a predetermined pulse width;

a leakage current monitor means for monitoring a leakage current of said memory cells, and for outputting a refresh active signal based on the monitored result;

a leakage current monitor control means for receiving said refresh active signal, and for outputting leakage current monitor control signals for deactivating said refresh active signal;

a self-refresh control means for receiving said self-refresh state signal and said refresh active signal, and for activating a self-refresh signal;

a ring oscillator for receiving said self-refresh signal, and for outputting a pulse signal having a predetermined period;

a frequency divider for receiving the pulse signal from the ring oscillator, and for outputting pulse signals having a new pulse period;

a self-refresh request state control means for combining said self-refresh state signal and one of the pulse signals output by said frequency divider, and for outputting a self-refresh request signal for refreshing said memory cells when said self-refresh signal is activated;

an internal row active control means for receiving said self-refresh request signal and activating an internal row address based on said self-refresh request signal; and means for receiving an uppermost address from the internal row active control means and for providing said self-refresh control means with a refresh termination signal for deactivating said self-refresh signal when a refreshing operation in said memory cells is terminated.

15. The self-refresh apparatus as claimed in claim 14, wherein said leakage current monitor means includes a plurality of memory cell leakage monitor circuits for monitoring the leakage current of the memory cell, and each of said plurality of memory cell leakage monitor circuits is installed in a respective bank and includes a plurality of word lines, a plurality of bit lines, a plurality of memory cells, and an integrator.

16. The self-refresh apparatus as claimed in claim 15, wherein said leakage current monitor means outputs said refresh active signal for activating the refresh operation when an output signal of any one of said plurality of memory cell leakage monitor circuits is an active signal.

17. The self-refresh apparatus as claimed in claim 14, wherein said self-refresh control means comprises:

a first logic gate for receiving said refresh active signal and said self-refresh state signal as input signals;

a second logic gate for receiving an inverted signal of said self-refresh state signal and said refresh termination signal as input signals; and a third logic gate for receiving output signals of said first and second logic gates and for outputting a variable self-refresh signal.

18. The self-refresh apparatus as claimed in claim 14, wherein said means for providing said self-refresh control means with said refresh termination signal is a D flip-flop.

19. The self-refresh apparatus as claimed in claim 15, wherein said leakage current monitor control means includes:

a pulse generator for generating a pulse signal having the same phase when said refresh active signal in inputted;

a monitor control signal generating unit for receiving the pulse signal, and for activating said plurality of word lines, said plurality of bit lines, said plurality of memory cells, and said integrator.

* * * * *